(12) United States Patent
Wu et al.

(10) Patent No.: US 7,709,963 B2
(45) Date of Patent: May 4, 2010

(54) AUDIO POWER AMPLIFIER PACKAGE

(75) Inventors: Kuo-Hung Wu, Sinshih Township, Tainan County (TW); Po-Yu Li, Sinshih Township, Tainan County (TW)

(73) Assignee: Himax Analogic, Inc. (TW)

( * ) Notice: Subject to any disclaimer, the term of this patent is extended or adjusted under 35 U.S.C. 154(b) by 249 days.

(21) Appl. No.: 11/865,647

(22) Filed: Oct. 1, 2007

(65) Prior Publication Data

US 2009/0085229 A1      Apr. 2, 2009

(51) Int. Cl.
*H01L 23/12* (2006.01)

(52) U.S. Cl. .................. 257/773; 257/780; 257/E23.01; 257/E23.012

(58) Field of Classification Search .................. 257/773, 257/780, 781, E23.01, E23.012
See application file for complete search history.

(56) References Cited

U.S. PATENT DOCUMENTS

| 5,646,451 | A | * | 7/1997 | Freyman et al. | .............. 257/784 |
| 5,798,571 | A | * | 8/1998 | Nakajima | .................... 257/784 |

* cited by examiner

*Primary Examiner*—Zandra Smith
*Assistant Examiner*—Paul E Patton
(74) *Attorney, Agent, or Firm*—Hayes Soloway P.C.

(57) ABSTRACT

An audio power amplifier package includes a non-signal lead, a first non-signal pad, a second non-signal pad and a plurality of bonding wires. The first non-signal pad and the second non-signal pad are disposed on a substrate. The bonding wires connect the non-signal lead to the first non-signal pad and the second non-signal pad respectively.

4 Claims, 1 Drawing Sheet

AUDIO POWER AMPLIFIER PACKAGE

BACKGROUND

1. Field of Invention

The present invention relates to a package. More particularly, the present invention relates to an audio power amplifier package.

2. Description of Related Art

Modern electronic products typically enclose a semiconductor chip and a carrier for electrically connecting with the semiconductor chip. At present, there are three major techniques for connecting a chip to a carrier, namely, a wire-bonding process, a flip-chip process and a tape-automated-bonding (TAB) process. If the carrier is a lead frame, the wire-bonding process is often used to connect the chip with the leads on the lead frame.

For a conventional audio power amplifier which is fabricated by using the wire-bonding process, in order to meet the need for package size and die size when designing the audio power amplifier, switches and other circuits, such as operational amplifiers and band-gap reference circuits, in the audio power amplifier have to be powered at one time through one pin of the audio power amplifier package. Thus, the switches which need high switching power usually produce some interference and power noise to seriously affect the operational amplifiers and band-gap reference circuits which need pure power. Accordingly, the wired-bonding and layout part of the package have to be modified, so as to solve the problem of the interference and power noise.

SUMMARY

In accordance with one embodiment of the present invention, an audio power amplifier package is provided. The audio power amplifier package includes a non-signal lead, a first non-signal pad, a second non-signal pad and a plurality of bonding wires. The first non-signal pad and the second non-signal pad are disposed on a substrate. The bonding wires connect the non-signal lead to the first non-signal pad and the second non-signal pad respectively.

In accordance with another embodiment of the present invention, an audio power amplifier package is provided. The audio power amplifier package includes a substrate, a plurality of pads, a plurality of leads and a plurality of bonding wires. The pads are disposed on the substrate and include a first non-signal pad and a second non-signal pad. The leads include a non-signal lead. The bonding wires connect the non-signal lead to the first non-signal pad and the second non-signal pad respectively.

For the foregoing embodiments of the present invention, the audio power amplifier package can be applied to solve the problem of the interference and power noise, and the circuits in the audio power amplifier, such as the operational amplifiers and the band-gap reference circuits, can have better power supply rejection ratio (PSRR). Furthermore, the total harmonic distortion plus noise (THD+N) of the audio power amplifier can be thus improved as well.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The invention can be more fully understood by reading the following detailed description of the embodiments, with reference made to the accompanying drawing as follows.

DESCRIPTION OF THE PREFERRED EMBODIMENTS

Figure 1:
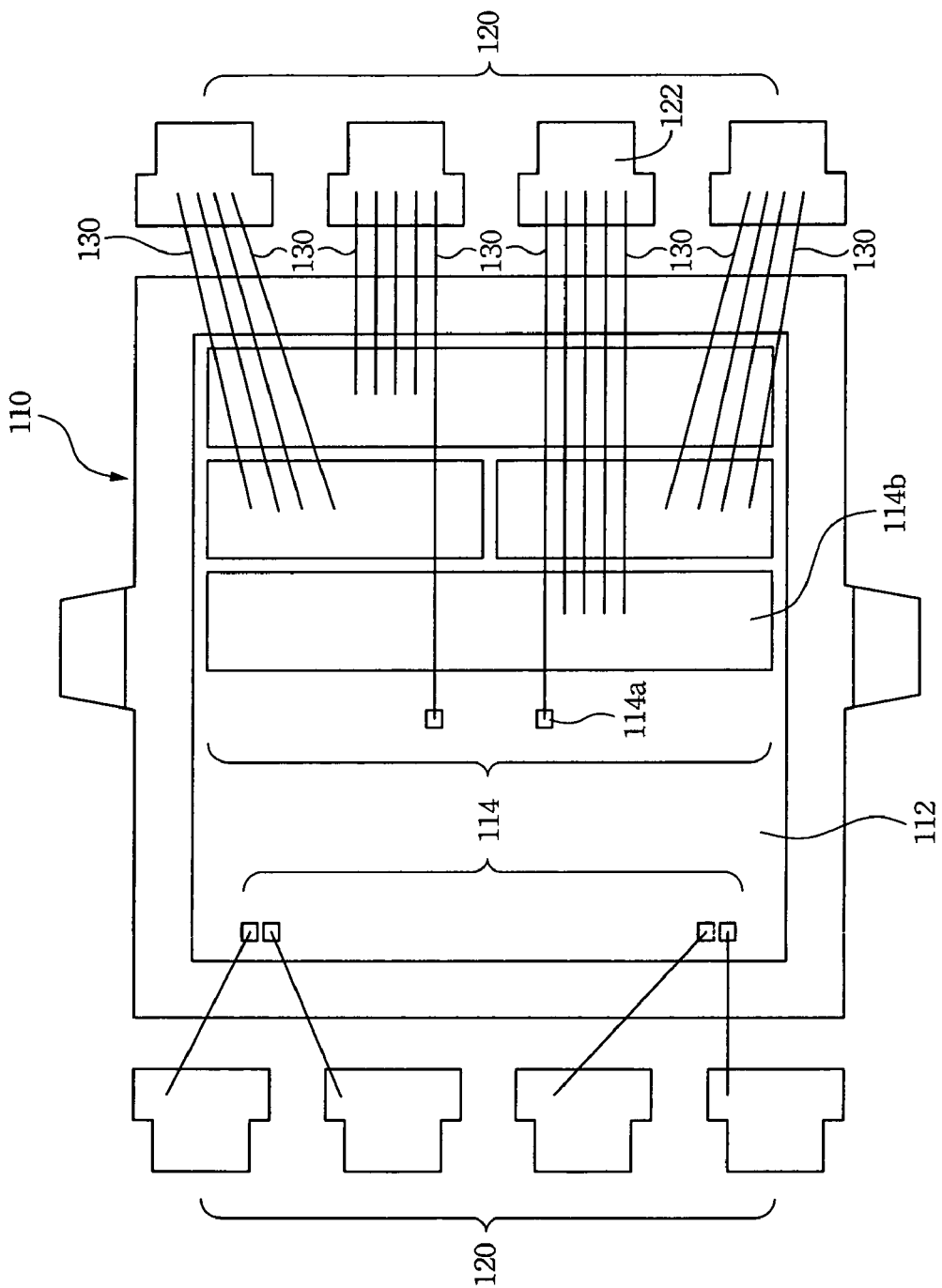
FIG. 1 is a top view of an audio power amplifier package according to one embodiment of the present invention.

In the following detailed description, the embodiment of the present invention has been shown and described. As will be realized, the invention is capable of modification in various obvious respects, all without departing from the invention. Accordingly, the drawings and description are to be regarded as illustrative in nature, and not restrictive.

The embodiment of the present invention discloses an audio power amplifier package, which includes a non-signal lead, two non-signal pads and a plurality of bonding wires. The bonding wires connect the non-signal lead to both of the non-signal pads respectively, such that signals can be separately transmitted from the non-signal lead to both of the non-signal pads through the bonding wires. Therefore, the interference and power noise can be avoided during the operation of the audio power amplifier.

FIG. 1 is a top view of an audio power amplifier package according to one embodiment of the present invention. The audio power amplifier package 100 includes a chip 110, a plurality of leads 120 and a plurality of bonding wires 130, in which the chip 110 includes a substrate 112 and a plurality of pads 114. The pads 114 are disposed on the substrate 112 and electrically connected to the leads 120 by the bonding wires 130. Furthermore, the pads 114 include a first non-signal pad 114a and a second non-signal pad 114b, in which both the first non-signal pad 114a and the second non-signal pad 114b are power pads. The leads 120 include a non-signal lead 122, in which the non-signal lead 122 is a power lead.

A number of the bonding wires 130 are used to electrically connect the non-signal lead 122 to the first non-signal pad 114a and the second non-signal pad 114b respectively by the wire-bonding process; that is, the power lead is electrically connected to both of the power pads respectively by the bonding wires 130. As a result, the first non-signal pad 114a, i.e. power pad, can receive a first power that is provided for powering the operational amplifiers and band-gap reference circuits in the audio power amplifier, such as a pure power, from the non-signal lead 122, i.e. power lead, through at least one of the corresponding bonding wires 130; the second non-signal pad 114b, i.e. another power pad, can receive a second power that is provided for powering the switches in the audio power amplifier, such as a switching power, which is larger than the first power, from the non-signal lead 122 through at least one of the corresponding bonding wires 130. Therefore, the power for different purposes can be separately transmitted to the corresponding pads, so as to avoid the interference and power noise generated when the power is supplied for the chip 110.

Although power pad/lead are used as examples in the foregoing embodiment, ground pad/lead may also be used to replace the power pad/lead in another embodiment. The term "non-signal" may be used to imply it is either a power or a ground.

For the foregoing embodiment of the present invention, the audio power amplifier package can be applied to solve the problem of the interference and power noise, and the circuits in the audio power amplifier, such as the operational amplifiers and the band-gap reference circuits, can have better power supply rejection ratio (PSRR). Furthermore, the total harmonic distortion plus noise (THD+N) of the audio power amplifier can be thus improved as well.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An audio power amplifier package, comprising:
   a non-signal lead;
   a first non-signal pad disposed on a substrate;
   a second non-signal pad disposed on the substrate; and
   a plurality of bonding wires connecting the non-signal lead to the first non-signal pad and the second non-signal pad respectively;
   wherein the first non-signal pad is configured for receiving a first power from the non-signal lead through at least one of the bonding wires, and the second non-signal pad is configured for receiving from the non-signal lead through at least one of the bonding wires a second power that is larger than the first power.

2. The audio power amplifier package as claimed in claim 1, wherein the non-signal lead is a power lead.

3. An audio power amplifier package, comprising:
   a substrate;
   a plurality of pads disposed on the substrate and comprising a first power pad for receiving a first power and a second power pad for receiving a second power that is larger than the first power;
   a plurality of leads comprising a non-signal lead; and
   a plurality of bonding wires connecting the non-signal lead to the first non-signal pad and the second non-signal pad respectively, wherein the first power pad receives the first power from the non-signal lead through at least one of the bonding wires and the second power pad receives the second power from the non-signal lead through at least one of the bonding wires.

4. The audio power amplifier package as claimed in claim 3, wherein the non-signal lead is a power lead.

* * * * *